(12) United States Patent
Yokoyama

(10) Patent No.: US 9,485,577 B2
(45) Date of Patent: *Nov. 1, 2016

(54) AUDIO OUTPUT DEVICE

(71) Applicant: ROHM CO., LTD., Kyoto-shi, Kyoto (JP)

(72) Inventor: Yasutomo Yokoyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 240 days.

This patent is subject to a terminal disclaimer.

(21) Appl. No.: 14/227,369

(22) Filed: Mar. 27, 2014

(65) Prior Publication Data

US 2014/0211964 A1 Jul. 31, 2014

Related U.S. Application Data

(63) Continuation of application No. 13/216,547, filed on Aug. 24, 2011, now Pat. No. 8,725,280.

(30) Foreign Application Priority Data

Aug. 26, 2010 (JP) ................... 2010-189349

(51) Int. Cl.
*H04R 3/02* (2006.01)
*H04M 3/00* (2006.01)
*G11B 20/00* (2006.01)
*H03M 3/00* (2006.01)

(52) U.S. Cl.
CPC ............... *H04R 3/02* (2013.01); *H03M 3/346* (2013.01); *H03M 3/454* (2013.01); *G11B 2020/00065* (2013.01)

(58) Field of Classification Search
CPC ....... H03G 3/34; H03G 3/341; H03M 1/145; H03M 1/16; H03M 3/30; H03M 3/346; H03M 3/362; H03M 3/39; H03M 3/392; H03M 3/422; H03M 3/454; H03M 3/478; H03M 3/506; H03M 7/3035; H03M 7/304; G11B 20/10037; G11B 20/10009; G11B 27/031; G11B 2020/00065
See application file for complete search history.

(56) References Cited

U.S. PATENT DOCUMENTS

| | | | |
|---|---|---|---|
| 7,110,460 B1 | 9/2006 | Melanson et al. | |
| 2005/0163232 A1 | 7/2005 | Norsworthy et al. | |
| 2005/0285765 A1* | 12/2005 | Suzuki | H03M 7/3011 341/143 |
| 2009/0238379 A1 | 9/2009 | Feng | |

FOREIGN PATENT DOCUMENTS

| | | |
|---|---|---|
| JP | 09-307447 A | 11/1997 |
| JP | 2001-237707 A | 8/2001 |
| JP | 2003-298425 A | 10/2003 |

* cited by examiner

*Primary Examiner* — Jesse Elbin
(74) *Attorney, Agent, or Firm* — Cantor Colburn LLP

(57) ABSTRACT

Provided is an audio output device capable of preventing noises and improving the S/N ratio even if no audio signal is inputted in the middle of the input of audio signals, or even if an audio-signal input state and a no-signal state are alternately repeated. In the provided audio output device, a multiplier is provided on the input side of each of the delayers. Each multiplier multiplies the addition output of the corresponding one of adders by a multiplier coefficient supplied by the coefficient counter. If there is no input of digital audio signals into a ΔΣ modulator, the counter control circuit decreases the output of the coefficient counter down to 0 stepwise at predetermined intervals.

9 Claims, 3 Drawing Sheets

AUDIO OUTPUT DEVICE

CROSS REFERENCE TO RELATED APPLICATION

The present application is a continuation application of U.S. patent application Ser. No. 13/216,547, filed on Aug. 24, 2011, the entire contents of which are incorporated herein by reference and priority to which is hereby claimed. The present application likewise claims priority under 35 U.S.C. §119 to Japanese Application No. 2010-189349, filed Aug. 26, 2010, the entire content of which is also incorporated herein by reference.

BACKGROUND OF THE INVENTION

1. Field of the Invention

The invention relates to an audio output device used in apparatuses to output sounds, such as TV sets, radio-cassette players, car audios, home theaters, and component stereo sets.

2. Description of the Related Art

With recent development of LSI technologies, digital audio apparatuses, such as CD players and MD players, come to use 1-bit digital analog converters (DACs) to process and amplify digital signals. The 1-bit DAC performs noise shaping on audio signals by using a ΔΣ modulator, and then outputs the resultant audio signals as pulse-width modulated signals, specifically, as 1-bit PWM signals.

A conventional first-order ΔΣ modulator as one type of above-described ΔΣ modulator has a configuration shown in FIG. 4. FIG. 4 illustrates components of the first-order ΔΣ modulator by using a Z function obtained through the Z-transform. Note that $Z^{-1}$ represents a delay element to delay the input by one sampling clock.

The first-order ΔΣ modulator shown in FIG. 4 includes: a subtractor 81; an accumulator 90 that includes an adder 82 and a delayer 84; a delayer 85; a multiplier 86; and a quantizer (Q) 83. The subtractor 81 subtracts a feedback signal W from an input signal X. The accumulator 90 accumulates outputs S of the subtractor 81 for every sampling clock.

The quantizer 83 generates binary-quantized output signals Q(Z) by outputting "+Δ" if the output Y of the accumulator 90 is equal to or larger than zero (i.e., Y≥0), and by outputting "−Δ" if the output Y of the accumulator 90 is smaller than zero (i.e., Y<0). Each output signal Q(Z) is delayed by the delayer 85 by one sampling clock, and is inputted as the feedback signal W to the subtractor 81 through the multiplier 86.

The first-order ΔΣ modulator is a feedback system with the above-described components. The first-order ΔΣ modulator is a modulator to convert the input signals X with a dynamic range from −Δ to +Δ into binary-quantized signals (+Δ, −ΔA) in synchronization with the sampling clocks for the two delayers 84 and 85.

Apparatuses to output sounds, such as TV sets and audio players by use of such ΔΣ modulators as one described above usually use higher-order ΔΣ modulators to improve the quality of the sounds. As described in Japanese Patent Application Publications Nos. Hei 9-307447, 2001-237707, and 2003-298425, a higher-order ΔΣ modulator includes plural accumulators and quantizers cascaded within a single loop.

SUMMARY OF THE INVENTION

Here suppose a case where a conventional ΔΣ modulator receives a digital audio signal, and then comes to receive no signal. In this case, provided with an accumulator using a delayer as described above, the ΔΣ modulator holds the accumulated data even if the ΔΣ modulator receives no input. The remaining data circulate as a feedback signal in the accumulator, and generate small noises to worsen the S/N ratio. If a higher-order ΔΣ modulator is used, the plural cascaded accumulators increase the influence of the noises.

The invention has been made to solve the above-described problem, and an object of the invention is to provide an audio output device capable of preventing noises and improving the S/N ratio even if no audio signal is inputted in the middle of the input of audio signals, or even if an audio-signal input state and a no-signal state are alternately repeated.

To achieve the above-described object, an audio output device according to the invention is mainly characterized by comprising a ΔΣ modulator including: a quantizer configured to quantize a signal; a subtractor configured to subtract a feedback signal from the quantizer from an inputted digital audio signal; an accumulator configured to accumulate output signals from the subtractor and to output the accumulated output signals to the quantizer side; a delayer included in the accumulator; a multiplier included in the accumulator and connected to an input side of the delayer; and a multiplier coefficient control circuit configured to supply a multiplier coefficient to the multiplier, wherein, in the ΔΣ modulator, the multiplier coefficient control circuit decreases the multiplier coefficient down to 0 stepwise at predetermined intervals if there is no input of the digital audio signal.

The audio output device of the invention includes a ΔΣ modulator that includes an accumulator including both a delayer and a multiplier provided on the input side of the delayer. The multiplier coefficient of the multiplier is controlled by a multiplier coefficient control circuit. If there is no input of digital audio signals, the ΔΣ modulator makes the multiplier coefficient control circuit decrease the multiplier coefficient down to 0 stepwise at predetermined intervals. Accordingly, the audio output device can delete the data that remain in the accumulator, and thus can prevent the noises that would otherwise be generated if there is no input of signals.

DESCRIPTION OF THE PREFERRED EMBODIMENTS

Figure 1:
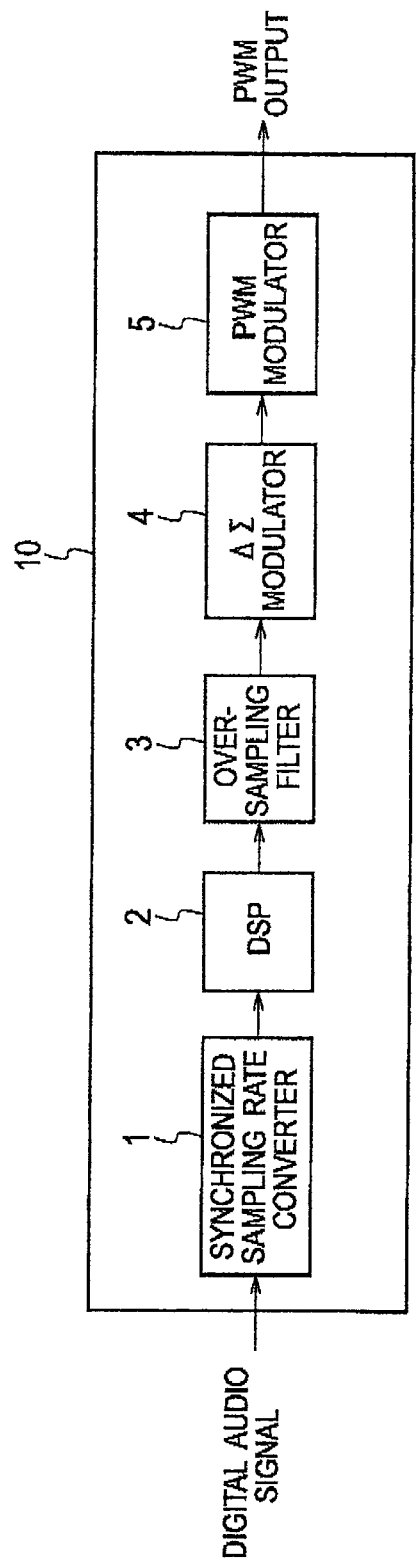
FIG. 1 is a schematic block diagram illustrating the configuration of an audio output device according to the invention.

An embodiment of the invention is described below by referring to the drawings. The drawings are schematic, and are different from the reality. Moreover, the drawings also include portions having different dimensional relationships and ratios from each other.

FIG. 1 illustrates a basic configuration of an audio output device 10 according to the invention. The audio output device 10 includes a synchronized sampling rate converter 1, a digital signal processor (DSP) 2, an over-sampling filter 3, a ΔΣ modulator 4, a PWM modulator 5, and the like.

The synchronized sampling rate converter 1 converts sampling frequencies of 8 kHz, 12 kHz, 16 kHz, 24 kHz, 32 kHz, 48 kHz, 96 kHz, and the like of PCM signals, which are inputted digital audio signals, into a sampling frequency of 48 kHz that is suitable for processing at later stages. In addition, the synchronized sampling rate converter 1 converts sampling frequencies of 11.025 kHz, 22.05 kHz, 44.1 kHz, 88.2 kHz, and the like of the inputted PCM signals into a sampling frequency of 44.1 kHz that is suitable for processing at the later stages.

The signals outputted from the synchronized sampling rate converter 1 are inputted into the DSP 2, and are configured by, for instance, a parametric-equalizer circuit or the like, where adjustment or the like are performed on the volume and the frequency characteristics of the digital audio signals.

After the signal processing performed in the DSP 2, the data are inputted into the over-sampling filter 3. The over-sampling filter 3 performs an over-sampling based on the input sampling frequency of the signals inputted into the over-sampling filter 3. The over-sampling is performed at such frequencies as the double, the quadruple, or the octuple of the input sampling frequency.

The ΔΣ modulator 4 modulates the PCM signals inputted from the over-sampling filter 3 into multi-value PDM (pulse density modulation) signals. The PWM modulator 5 modulates the inputted PDM signals into PWM signals for each of the L/R channels, that is, into 1-bit (binary) signals. Here, the ΔΣ modulator 4 may be configured to modulate the PCM signals into binary PDM signals in advance.

The processing of signals described thus far is a pure, digital signal processing. The operations of the processing are controlled on the basis of the reference clock signals generated by, for instance, an unillustrated crystal oscillator circuit.

Subsequently, for instance, the PWM-outputted signals for each of the L/R channels are subjected to a switching amplification, and then, from the amplified signals, unnecessary high-frequency content (noise content) is removed by a LPF or the like. The resultant signals are sent to a speaker or the like.

Figure 2:
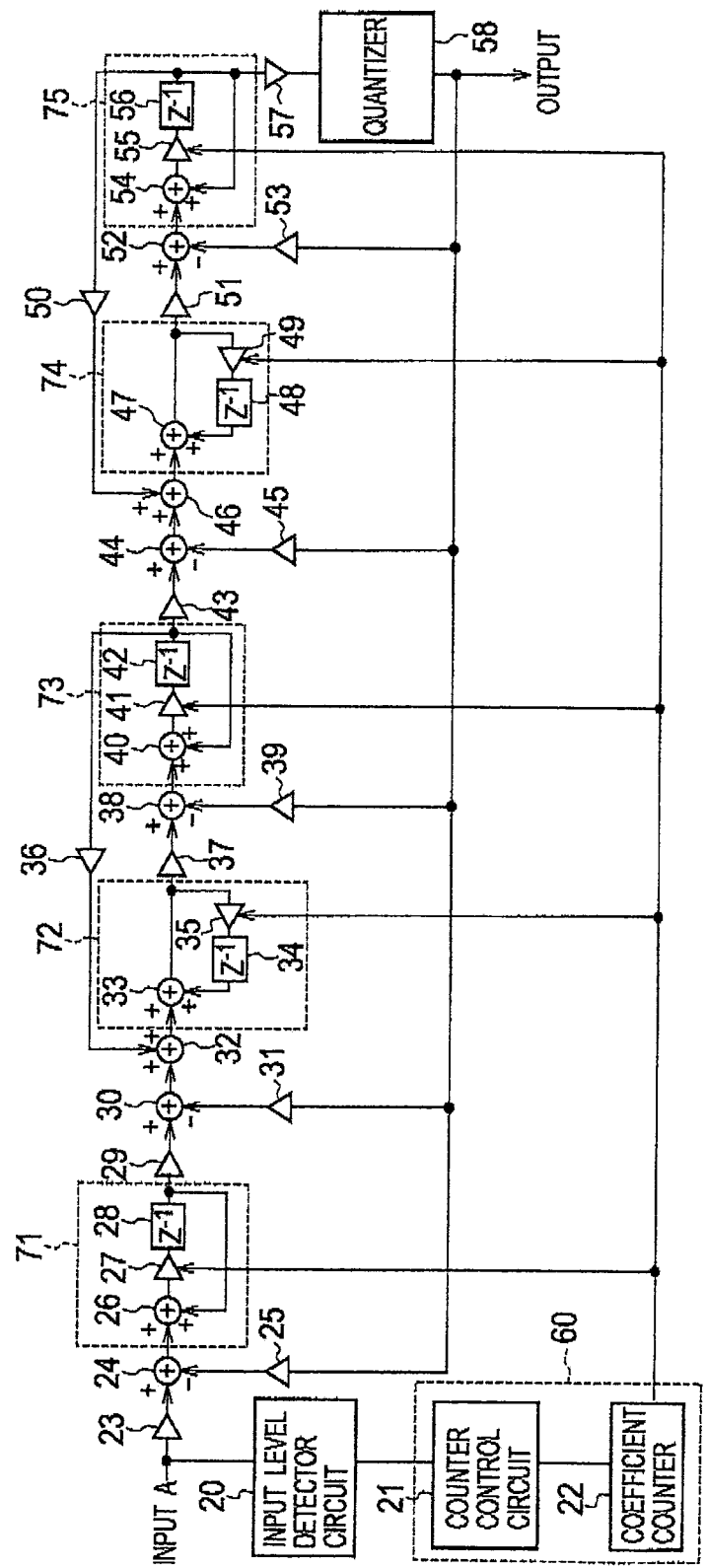
FIG. 2 is a block diagram illustrating the configuration of a ΔΣ modulator provided in the audio output device according to the invention.

The ΔΣ modulator 4 includes, for instance, a fifth-order ΔΣ modulator including five accumulators as shown in FIG. 2. Detail description of the ΔΣ modulator 4 is provided below. In the ΔΣ modulator shown in FIG. 2, within a single loop starting from the pre-processed digital audio signal serving as the signal for an input A and ending with the feedback from the quantizer 58 to the input A side, five accumulators 71 to 75 are cascaded between the input terminal of the input A and the quantizer 58. The output of the quantizer 58 is fed back to the accumulators 71 to 75 via multipliers 25, 31, 39, 45, and 53 respectively.

The quantizer 58 performs a quantization processing on the output of the accumulator 75 of the fifth stage, and thus derives quantized data.

The accumulator 71 of the first stage makes an addition output of an adder 26 pass through a multiplier 27, and then delays the resultant data by means of a delayer 28. Then, the accumulator 71 returns the delayed data back to the adder 26 through a feedback loop, and adds the returned data to the subtraction output of a subtractor 24. Accordingly, the accumulator 71 accumulates the subtraction outputs of the subtractor 24 for every sampling clock, that is, performs an integral treatment. The integral treatment function is similarly performed by the other accumulators 72 to 75. Accordingly, no further description of the accumulation function will be provided below.

The quantized data from the quantizer 58 are inputted into the multiplier 25, and then the multiplication output of the multiplier 25 is fed back to the subtractor 24. The subtractor 24 subtracts the multiplication output of the multiplier 25 from the multiplication output of a multiplier 23, where the digital audio signal from the input A is multiplied.

The accumulator 72 of the second stage returns the addition output of an adder 33 back to a feedback loop. In the feedback loop, the addition output is made to pass through a multiplier 35 and is then delayed by a delayer 34. The resultant data are returned back to the adder 33, where the returned data are added to the addition output of an adder 32.

The quantized data fed back from the quantizer 58 are multiplied by the multiplier 31. A subtractor 30 is provided to subtract the multiplication output of the multiplier 31 from the multiplication output of a multiplier 29. The subtraction output of the subtractor 30 is added by the adder 32, provided on the input side of the accumulator 72 of the second stage, to the output of the multiplication performed by a multiplier 36 on the output of the accumulator 73 of the third stage.

The accumulator 73 of the third stage makes the addition output of an adder 40 pass through a multiplier 41. The resultant data are delayed by a delayer 42, and are then returned back to the adder 40 through a feedback loop. The fed-back data are added to the subtraction output of a subtractor 38.

The quantized data fed back from the quantizer 58 are multiplied by the multiplier 39. The subtractor 38 is provided to subtract the multiplication output of the multiplier 39 from the multiplication output of a multiplier 37.

The accumulator 74 of the fourth stage returns the addition output of an adder 47 back to a feedback loop. In the feedback loop, the addition output is made to pass through a multiplier 49 and is then delayed by a delayer 48. The resultant data are returned back to the adder 47, where the returned data are added to the addition output of an adder 46.

The quantized data fed back from the quantizer 58 are multiplied by the multiplier 45. A subtractor 44 is provided to subtract the multiplication output of the multiplier 45 from the multiplication output of a multiplier 43. The subtraction output of the subtractor 44 is added by the adder 46, provided on the input side of the accumulator 74 of the fourth stage, to the output of the multiplication performed by a multiplier 50 on the output of the accumulator 75 of the fifth stage.

The accumulator 75 of the fifth stage makes the addition output of an adder 54 pass through a multiplier 55. The resultant data are delayed by a delayer 56, and are then returned back to the adder 54 through a feedback loop. The fed-back data are added to the subtraction output of a subtractor 52.

The quantized data fed back from the quantizer 58 are multiplied by the multiplier 53. The subtractor 52 is provided to subtract the multiplication output of the multiplier 53 from the multiplication output of a multiplier 51.

As has been described above, the multiplier 29 is provided on the output side of the accumulator 71. The multiplier 37 is provided on the output side of the accumulator 72.

The multiplier 43 is provided on the output side of the accumulator 73. The multiplier 51 is provided on the output side of the accumulator 74. In addition, a multiplier 57 is provided on the output side of the accumulator 75. These multipliers 29, 37, 43, 51, and 57 serve as attenuators. In the higher-order ΔΣ modulator, each of the multiplier 29, 37, 43, 51, and 57 provided to prevent oscillation has a multiplier coefficient smaller than one.

In the accumulators 71 to 75, the multipliers 27, 35, 41, 49, and 55 are respectively provided on the input sides of their corresponding delayers 28, 34, 42, 48, and 56, and are respectively connected to their corresponding delayers 28, 34, 42, 48, and 56. Each of the multipliers 27, 35, 41, 49, and 55 multiplies the addition output of the corresponding one of the adders 26, 33, 40, 47, and 54 by a multiplier coefficient supplied from a coefficient counter 22.

An input level detector circuit 20 is connected to a terminal of the input A. The input level detector circuit 20 is a circuit to detect whether or not there is any digital audio signal being inputted into the input A. In the detection, a threshold of a certain level is predetermined to distinguish digital audio signals from noise content. If the input level that is not over the threshold continues for a certain length of time, the input level detector circuit 20 judges that there is no digital audio signal being inputted. (i.e., input of digital audio signals=0). If detecting a digital signal exceeding the threshold after a judgment of "input of digital audio signals=0," the input level detector circuit 20 judges that another digital audio signal is being inputted.

The output of the input level detector circuit 20 is supplied to a multiplier coefficient control circuit 60. The multiplier coefficient control circuit 60 includes a counter control circuit 21 and the coefficient counter 22. The multiplier coefficient control circuit 60 controls the multiplier coefficients to be supplied to each of the multipliers 27, 35, 41, 49, and 55. Each of the multiplier coefficients basically has a value ranging from 0 to 1.

The counter control circuit 21 controls the coefficient counter 22. Specifically, the counter control circuit 21 gives a preset value to the coefficient counter 22 serving as a counter. In addition, the counter control circuit 21 makes the coefficient counter 22 perform an adding or subtracting operation on the count. In the initial state, the counter control circuit 21 gives a value 1 to the coefficient counter 22 as its preset value.

If a judgment signal indicating that "the digital-audio-signal input=0" is supplied by the input level detector circuit 20 to the counter control circuit 21, the counter control circuit 21 controls the coefficient counter 22 so that the count of the coefficient counter 22 can be reduced gradually from 1 to 0. If a judgment signal indicating that "the digital-audio-signal input=0" supplied to the counter control circuit 21 is followed by the reception of a judgment signal indicating the input of another digital audio signal, the counter control circuit 21 controls the coefficient counter 22 so that the count of the coefficient counter 22 can be increased gradually from 0 to 1.

Basic operations of the input level detector circuit 20 and the multiplier coefficient control circuit 60 are described below by referring to FIG. 3. The upper side of FIG. 3 is dedicated to the signals supplied to the input A while the lower side is dedicated to the output of multiplier coefficients from the coefficient counter 22.

Digital audio signals that are the output of the over-sampling filter 3 shown in FIG. 1 are inputted into the input A. The digital audio signals are supplied through the multiplier 23 to the subtractor 24, where the feedback signal outputted by the quantizer 58 is subtracted from the multiplication output of the multiplier 23. The output of the subtractor 24 is supplied to the accumulator 71 of the first stage. From then onwards, the signals are processed in the course of the configuration described above. What characterizes the signal processing is the multiplier provided on the input side of the delayer in each of the accumulators and the use of the output of the multiplier as the input of the corresponding delayer.

Figure 3:
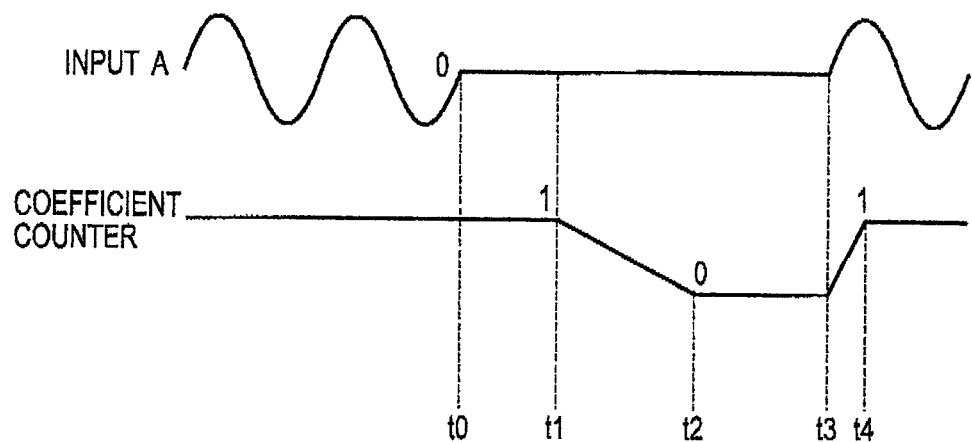
FIG. 3 is a chart illustrating the relationship between the pre-processing input signal in the ΔΣ modulator and the coefficient set in a multiplier provided in an accumulator.
Figure 4:
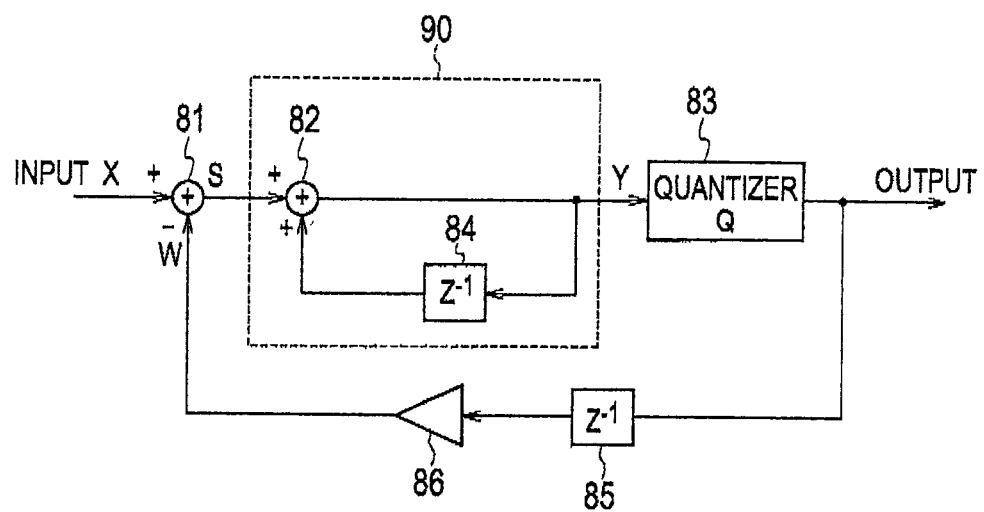
FIG. 4 is a block diagram illustrating the configuration of a conventional first-order ΔΣ modulator.

FIG. 3 shows that, in the initial state, digital audio signals are continuously inputted by the over-sampling filter 3 to the ΔΣ modulator 4. In the meanwhile, a multiplier coefficient of 1 is supplied to each of the multipliers 27, 35, 41, 49, and 55.

Then, at time t0, there is no digital audio signal being supplied to the input A (i.e., input signal=0). At this point of time, the input level detector circuit 20 detects the fact that there is no input signal (i.e., input signal=0) by comparing the level of the signal with a predetermined threshold, and judges whether or not the detected state of "input signal=0" continues uninterruptedly for a predetermined length of time—e.g., for 43 ms. At time t1, which is 43 ms after time t0, the input level detector circuit 20 judges that there is no input of digital audio signals (e.g., input of digital audio signals=0), and sends the signal indicating the judgment result to the counter control circuit 21.

Upon receiving the judgment signal indicating "input of digital audio signals=0" from the input level detector circuit 20, the counter control circuit 21 performs a count-down control on the coefficient counter 22. How the counting down is going is shown in the period from time t1 to time t2. In the period from time t1 to t2, the coefficient counter 22 transitions from the state of 1 to the state of 0 stepwise. The transition time from time t1 to time t2 is, for instance, 20 ms.

Once the coefficient counter 22 comes to have a value 0, a multiplier coefficient 0 is supplied (set) to each of the multipliers 27, 35, 41, 49, and 55 provided respectively in the accumulators 71 to 75. Hence, the multiplier 27, for instance, outputs a value obtained by multiplying the addition output of the adder 26 by the multiplier coefficient 0. Likewise, each of the other multipliers 35, 41, 49, and 55 outputs a value obtained by multiplying the addition output of the corresponding one of the adders 33, 40, 47, and 54 by multiplier coefficient 0. In this way, each of the delayers 28, 34, 42, 48, and 56 provided respectively in the accumulators 71 to 75 has an input of 0, and thus the data that would otherwise cause noises disappear.

At time t3, the input A that has been in a state of ""input of digital audio signals=0" comes to receive a new input of digital audio signals. At this point of time, the input level detector circuit 20 detects the existence of digital audio signals, and sends the detection signal to the counter control circuit 21. Upon receiving the judgment signal indicating the new input of digital audio signals, the counter control circuit 21 performs a count-up control on the coefficient counter 22. Then, as shown in the period from time t3 to time t4, the coefficient counter 22 transitions from the state of 0 to the state of 1 stepwise. The transition time from time t1 to t2 is, for instance, 5 ms.

As has been described thus far, even if the input of digital audio signals is interrupted to leave the input side of the accumulator with no input signal, and the data remaining in the delayer provided in the accumulator are fed back to the delayer through a feedback loop, the multiplier makes the delayer eventually have an input of 0. Accordingly, the noises that would otherwise be caused by the remaining data can be eliminated.

Note that a fifth-order ΔΣ modulator is used in the example described above, but a fourth-order, a six-order, or a seventh-order ΔΣ modulator may be used instead. Alternatively, a lower-order ΔΣ modulator, such as a second-order or a first-order ΔΣ modulator may be used instead. In addition, the ΔΣ modulator and the input/output signals may be of plural bits instead of those of 1-bit.

The configuration of the audio output device according to the invention is widely applicable not only to TV sets, radio-cassette players, car audios, home theaters, and component stereo sets but also to any system to perform transmission by sounds.

What is claimed is:

1. An audio output device comprising a ΔΣ modulator including:
    a quantizer configured to quantize a signal;
    a subtractor configured to subtract a feedback signal from the quantizer from an inputted digital audio signal;
    an accumulator configured to accumulate output signals from the subtractor and to output the accumulated output signals to the quantizer side;
    a delayer included in the accumulator; and
    a multiplier included in the accumulator and connected to an input side of the delayer, wherein
    in the ΔΣ modulator, an output of the multiplier is set to 0 if there is no input of the digital audio signal during a predetermined period.

2. The audio output device according to claim 1, further comprising a multiplier coefficient control circuit configured to supply a multiplier coefficient to the multiplier, wherein the output of e multiplier is set to 0 by setting the multiplier coefficient to 0 if there is no input of the digital audio signal during the predetermined period.

3. The audio output device according to claim 2, wherein
    a plurality of the accumulators are cascaded between an input terminal for digital audio signals and the quantizer,
    the feedback signal from the quantizer is fed back to each of the plurality of accumulators, and
    the multiplier coefficient of the multiplier coefficient control circuit is supplied to each of the multipliers provided respectively in the plurality of accumulators.

4. The audio output device according to, claim 2, wherein if an input of the digital audio signal restarts, the multiplier coefficient control circuit increases the multiplier coefficient up to 1 stepwise at predetermined intervals.

5. The audio output device according to claim 1, further comprising an input level detector circuit judging the presence of the digital audio signal, wherein the input level detector circuit judges that there is no digital audio signal if the input level of the digital audio signal that is not over a predetermined threshold continues for a certain length of time.

6. The audio output device according to claim 5, wherein a
    the multiplier coefficient control circuit includes a counter control circuit and a coefficient counter, and
    a judgment signal by the input level detector circuit is supplied to the counter control circuit.

7. The audio output device according to claim 6, wherein the counter control circuit performs a count-down control on the coefficient counter by the judgment signal indicating no digital audio signal from the input level detector circuit.

8. The audio output device according to claim 3, further comprising a multiplier for an attenuation wherein
    the multiplier for an attenuation is connected between the each accumulator.

9. The audio output device according to claim 1, wherein the accumulator includes the delayer and the multiplier and an adder.

* * * * *